SEMICONDUCTOR DIODE CONSTRUCTION WITH HEAT DISSIPATING HOUSING

Filed June 2, 1961

INVENTOR
SAUL I. SLATER
BY Darby & Darby
ATTORNEYS

United States Patent Office 3,217,213

Patented Nov. 9, 1965

3,217,213
SEMICONDUCTOR DIODE CONSTRUCTION WITH HEAT DISSIPATING HOUSING

Saul I. Slater, Glen Cove, N.Y., assignor to Slater Electric Inc., Glen Cove, N.Y., a corporation of New York Filed June 2, 1961, Ser. No. 114,394
8 Claims. (Cl. 317—234)

This invention relates to semiconductor devices and more particularly to an improved semiconductor diode construction.

As is well known, the current handling capacity of any semiconductor diode or rectifier is to a large extent limited by the amount of heat that the diode can dissipate. In the usual case, the diode is formed by a pellet, wafer or slice of a semiconductor material which has a junction of two dissimilar materials, for example, germanium or silicon, respectively, joined to indium or aluminum. The semiconductor materials are processed to have the property of rectifying A.C. current into D.C. current and the heat which is produced by the rectification process passes through the semiconductor material.

In a typical semiconductor diode construction, the semiconductor junction material is soldered to a mounting base formed of a metal having a low coefficient of expansion and the heat that is generated is dissipated through this base. When the base is attached to and made part of an airtight outer housing or casing, the heat dissipating ability of the diode then depends upon the dissipation of heat from both the base and the housing. Greater heat dissipation and consequently greater diode current handling capacity may be obtained by using a heat sink. The heat sink is usually a piece of metal having good heat transmitting characteristics to which the diode is fastened intimately in a manner to insure good thermal transmission of the heat from the diode to the heat sink.

When it is impractical to use a heat sink, because of its size or other undesirable features, as is generally the case in many circuit applications such as television circuitry, computer circuitry, etc., the current capacity of the diode is limited strictly by the heat dissipating ability of the diode by itself, without the use of an external heat sink. Many diodes heretofore have been made of a so-called "top hat" construction, in which the base of the diode for mounting the semiconductor material is either soldered or welded to the housing, leaving a circular flange outside the housing wall, and thus giving the diode extra area for heat dissipation. The disadvantage of this "top hat" type of construction lies in the fact that it increases the diode size. Other types of diodes more recently introduced on the market do not have a flange, but rather are of a cylindrical shape, the base of the cylinder being the part to which the semiconductor material is soldered. Such construction makes a smaller diode, which is a decided advantage, but it also reduces the diode's heat dissipating ability by virtue of the smaller heat dissipating surface area in contact with the external air. Another cylindrical diode currently being used has the semiconductor material soldered to the metallic central portion of a so-called glass "header," which is a metal-to-glass seal. In this diode the heat dissipating ability is further reduced because of the glass surrounding the central metal portion to which the semiconductor is soldered, the thermal conductivity to the external outer casing thereby being greatly reduced.

In accordance with the present invention, an improved semiconductor diode construction is provided which gives increased heat dissipating properties and hence higher current handling capabilities to the diodes. In the present invention the base on which the semiconductor material is mounted is made with a mounting surface and a depending wall thereby forming a generally concave or "cup"-shaped base. The base is attached to the diode outer casing with the end of the mounting surface and the depending wall in contact with the casing. By using this arrangement the surface area of heat dissipating material is made substantially larger without any increase in overall diode size, and the thermal conductivity from the base to the diode outer housing is also increased. Further, the base mounting surface for the semiconductor material is located towards the center of the outer housing rather than at one end thereof, so that the major portion of the heat is conducted to the outer housing near its center. The conduction of the heat to a more centralized portion of the housing, rather than at either end, allows a greater area on the housing for conduction of heat to either end. This is a decided advantage in cooling the diode.

It should also be realized that the use of the concave base also allows cooling air to circulate within the base "cup," thereby greatly enhancing the cooling of the diode base itself. By the use of the structure of the present invention, diodes have been constructed having increased current handling capacities of between 10% to 100% over diodes of the same size made with prior art constructions.

It is therefore an object of this invention to provide a semiconductor diode which is designed to dissipate heat more effectively, thereby increasing the capacity of the diode.

Another object of the invention is to provide a semiconductor diode in which the base on which the semiconductor material is mounted, is concave in shape.

Still a further object of the invention is to provide a semiconductor diode in which the semiconductor element is mounted on a concave base within a cylindrical outer casing.

Still another object of the invention is to provide a diode wherein the heat conducted from the semiconductor junction travels more nearly equally in two directions, that is, simultaneously, from the more centrally located joint between the base and the casing toward each end of the casing, rather than from only one end toward the other end.

A further object of the invention is to provide a semiconductor diode in which the semiconductor element is mounted on a concave base and the base is mounted within a rectangular outer casing.

Other objects and advantages of the present invention will become more apparent upon reference to the following specification and annexed drawings, in which.

Figure 1:
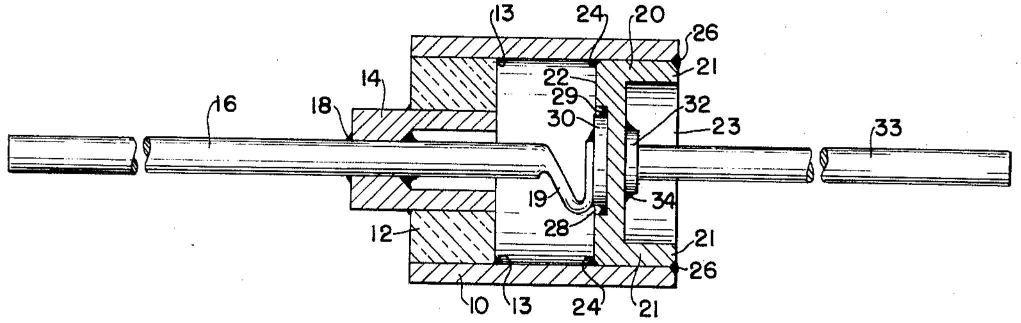
FIGURE 1 shows an overall view of a semiconductor diode taken partially in section which illustrates the principles of the present invention.

Referring to FIGURE 1, the semiconductor diode of the present invention is formed by a substantially cylindrical outer casing 10, which may be made of steel or other suitable material. At one end of the casing 10, a circular insulator 12, which is made of glass or other suitable insulating material, is fastened to the casing by a seal 13. The insulator 12 is formed with a hole at the center thereof through which a tubular metallic conducting lead exit 14 extends. The lead exit 14 is preferably flush with the end of the insulator within the casing and its other end extends for a distance beyond the casing end.

Sealed within the lead exit 14 by a solder ring seal 18 is one of the semiconductor connecting leads 16. The end of the lead 16 within the casing 10 is formed with an S-shaped section 19, the bottom of which makes electrical contact with the semiconductor junction material.

Located at the other end of the casing 10 opposite lead 16 is the semiconductor mounting base or cup 20. The mounting base 20 is of one-piece cup-shaped construction with a circular wall 21 extending downwardly from a circular mounting surface 22. A cooling pocket 23 is formed within the area surrounded by wall 21 and surface 22. The cup 20 is preferably made of copper or other suitable material having equally good heat conducting properties and is held to the casing 10 by means of the metal ring seals 24 and 26 around the inner periphery thereof. It should be noted that both the outer periphery of the mounting surface 22 and the base wall are in contact with the casing.

The circular mounting surface 22 inside of the casing 10 is formed with a substantially cylindrical depression 28. Held within the depression 28 by a solder seal 29 and in electrical contact with base 20 is a piece of semiconductor material 30. In accordance with the present invention, any type of semiconductor material may be used, for example, silicon or germanium, which has a junction formed, for example, by alloying or diffusing indium or aluminum. It should be realized, of course, that any suitable semiconductor material may be used in the present invention and the manner of making the material itself or junction forms no part of the present invention. Also, the semiconductor material may be held to the mounting surface 22 to make electrical contact therewith by any suitable means other than the solder seal 29, without departing from the principles of the invention.

The head end 32 of a second lead 33 is welded at 34 to the outside surface of the mounting base 20 to make electrical contact therewith. Lead 33 extends outwardly, beyond the end of the casing which holds the base 20. The two leads 16 and 33 are therefore electrically connected to the semiconductor material 30 and connect the semiconductor diode in its circuit applications.

The operation of the device is described as follows. The diode leads 16 and 33 are connected in the circuit by some suitable means such as soldering. As current passes through the diode and rectification occurs, heat is produced in the semiconductor element 30 and is conveyed to the cup 20. The circular cup wall 21 provides a relatively large radiating area for the heat generated at the junction. This area is also in contact with the casing 10 and transmits the heat thereto. Further, since the base 20 is mounted within the casing with the base surface 22 near the center of the casing, the larger portion of the heat, which occurs on base surface 22, is conducted by the base surface 22 to the casing near the center of the casing. This allows the heat at the casing to be transmitted toward either end of the casing rather than only to one end of the casing, as is the case in diodes where the mounting base surface is at the end of the diode casing. The arrangement shown thereby provides greater cooling. As another factor in cooling the diode, air also circulates in the concave space 23 to convey away some of the heat which is present in the cup 20.

Figures 2, 3, 4, 5:
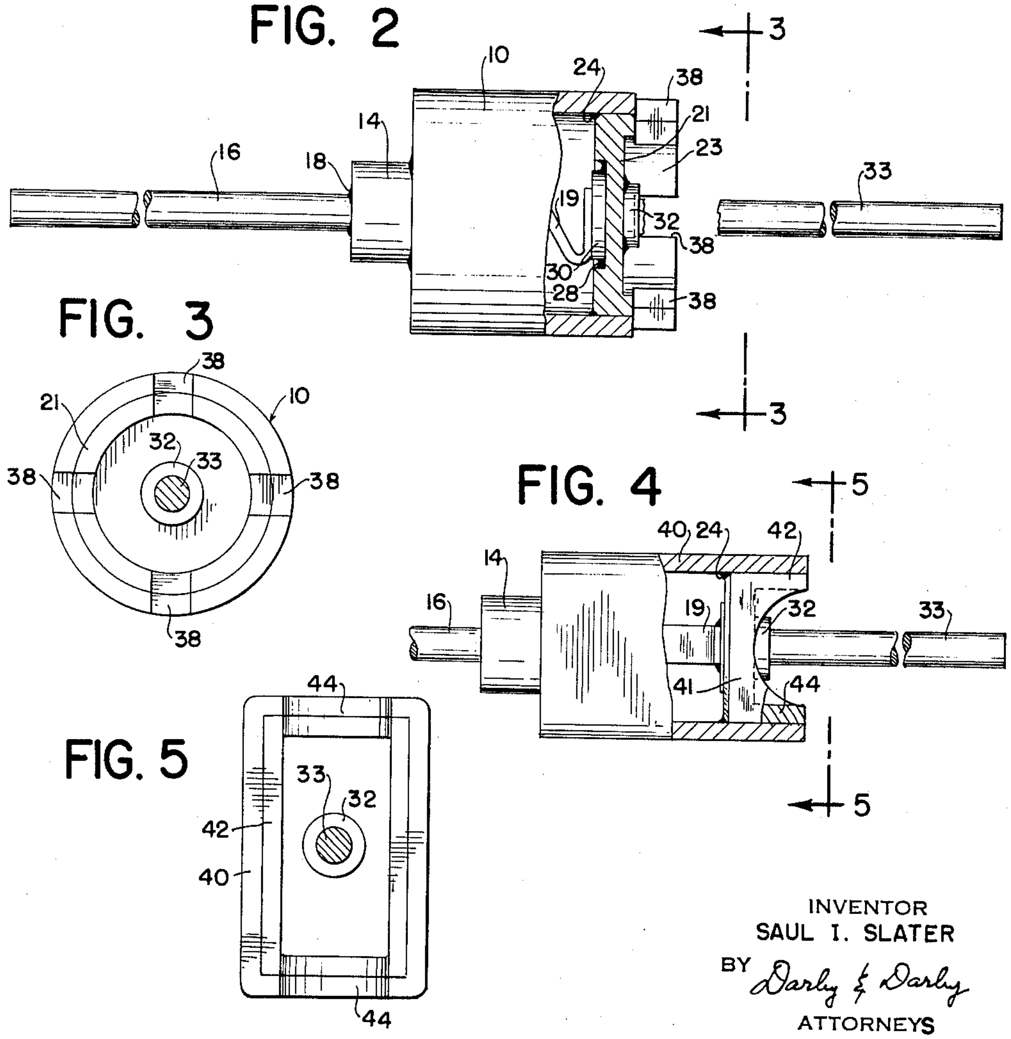
FIGURE 2 shows another embodiment of the invention taken partly in section in which notches in the outer casing and base are provided for greater cooling.
FIGURE 3 is an end view of the diode of FIGURE 2 looking along lines 3—3 of FIGURE 2.
FIGURE 4 shows an overall view of another embodiment of the invention taken partially in section.
FIGURE 5 is an end view of the diode of FIGURE 4 looking along lines 5—5, and rotated 90°.

FIGURES 2 and 3 show another embodiment of the invention in which those elements which are the same as previously described in FIGURE 1 are designated by the same reference characters. The diode shown in FIGURES 2 and 3 is substantially the same as that shown in FIGURE 1, except that at the end of the diode where the cup 20 is mounted, a plurality of notches 38 are formed in the outer casing 10 and the circular wall 21 of the cup 20 substantially the height of the wall 21. The notches provide better circulation of air through the cup space 23. While four notches 38 have been shown spaced approximately 90° apart, it should be realized that other suitable arrangements having more or less notches may be utilized.

FIGURES 4 and 5 show still another embodiment of the invention in which a rectangular shaped outer casing 40 is utilized instead of the tubular casing 10 of FIGURES 1–3. In this embodiment of the invention the mounting base 41 for the semiconductor element 30 is substantially rectangular in shape and is also made cup-shaped for the reasons previously described. The wall 42 of cup 41 extends a substantial distance into the casing 40 and is held there by a solder seal 24. The casing 40 and the wall 42 are cut to have notches 44 at the top and bottom thereof. Notches 44 are preferably semi-circular and provide an air passage along the height of the diode at the semiconductor end. This embodiment still maintains the additional radiating surface for the mounting base member, due to its concavity and also achieves a better air flow passage due to the semi-circular notches 44. Because of these features the diode can handle larger quantities of current.

It can therefore be seen that an arrangement has been provided for a semiconductor diode in which the current handling capacity of the diode is increased over prior art diodes of comparable size. The diode is relatively simple to produce because all of the parts may be pre-formed before assembly and there is no problem of aligning the semiconductor element 30 or the base element 20 to get a proper fit. For example, if desired, stops can be placed on the inside of the casing 10 so that the mounting base 20 can be properly located within the casing.

While a preferred embodiment of the invention has been described above, it will be understood that this embodiment is illustrative only and the invention is to be limited solely by the appended claims.

What is claimed is:

1. A semiconductor diode comprising a hollow heat conductive outer casing, a heat conductive base for mounting a semiconductor element formed by a mounting surface and a depending wall which forms a concave space, said base being mounted at one end of said casing with the wall in contact with said casing and the concave surface facing toward said one end of said casing, communicating notches in said depending wall of said base and in said casing to facilitate the passage of air through the space formed by said concave surface, and a semiconductor element mounted on and electrically connected to said base mounting surface on the side of said mounting surface opposite said concave space.

2. A semiconductor diode comprising a hollow heat conductive cylindrical outer casing, a heat conductive base for mounting a semiconductor element formed by a circular mounting surface and a depending wall which forms a concave space, said base being mounted at one end of said casing in contact with said casing and the concave surface facing toward said one end of said casing, communicating notches in said hollow cylindrical casing and said depending base wall to facilitate passage of air through the space formed by said concave surface, a semiconductor element mounted on and electrically connected to said base mounting surface on the side opposite said concave space, a lead electrically connected to said base, and a second lead connected to said semiconductor element.

3. A semiconductor diode comprising a hollow heat conductive substantially rectangular outer casing, a heat conductive base for mounting a semiconductor element formed by a substantially rectangular mounting surface and a substantially rectangular depending wall which forms a concave space, said base being mounted at one end of said casing in contact with said casing and the concave surface facing toward said one end of said casing, communicating notches in opposite sides of said rectangular casing and rectangular base wall to facilitate the flow of air through the space formed by said concave surface, a semiconductor element mounted on and electrically connected to said base mounting surface on the side opposite said concave space, a lead electrically connected to said base, and a second lead connected to said semi-conductor element.

4. A semiconductor diode as set forth in claim 3 wherein said notches are substantially semi-circular.

5. A semiconductor diode comprising a tubular heat conductive outer casing, a heat conductive base for mounting a semiconductor element formed by a circular mounting surface and a circular wall depending downwardly therefrom to form a concave surface, said base being mounted within one end of said casing with the circular depending wall making contact with the casing and the free end of said wall being adjacent said one end of said casing, a recess on the inner face of said circular surface for mounting a semiconductor element in electrical contact with said base within said casing, a lead electrically connected to the outer face of said circular base surface, and a second lead connected to said semiconductor element on the side opposite said base.

6. A semiconductor diode as set forth in claim 5 wherein a plurality of communicating notches are provided in said casing and said circular base wall, each notch being opposite another notch on the periphery of said wall and casing to facilitate the flow of air through the space formed by said concave surface.

7. A semiconductor diode comprising a substantially rectangular heat conductive outer casing, a heat conductive base for mounting a semiconductor element formed by a substantially rectangular mounting surface and a substantially rectangular wall depending downwardly therefrom to form a concave surface, said base being mounted within one end of said casing with the rectangular wall making contact with the casing and the free end of said wall being adjacent said one end of said casing, a recess on the inner face of said mounting surface for mounting a semiconductor element in electrical contact with said base within said casing, a lead electrically connected to the outer face of said base mounting surface, and a second lead connected to said semiconductor element on the side opposite said base.

8. A semiconductor diode as set forth in claim 7 wherein communicating notches are provided in said casing, and base walls to facilitate the flow of air through the space formed by said concave surface.

References Cited by the Examiner

UNITED STATES PATENTS

| | | | |
|---|---|---|---|
| 2,677,793 | 5/54 | Koury | 317—235 |
| 2,830,920 | 4/58 | Colson et al. | 317—235 |
| 2,853,661 | 9/58 | Houle et al. | 317—234 |
| 2,862,152 | 11/58 | Stelmak et al. | 317—234 |
| 2,917,686 | 12/59 | Boyer et al. | 317—234 |
| 3,030,557 | 4/62 | Dermit | 317—234 |

FOREIGN PATENTS

| | | |
|---|---|---|
| 851,751 | 11/60 | Great Britain. |

JOHN W. HUCKERT, *Primary Examiner.*

GEORGE N. WESTBY, DAVID J. GALVIN, *Examiners.*